United States Patent
Kern

(10) Patent No.: US 9,263,849 B2
(45) Date of Patent: Feb. 16, 2016

(54) IMPEDANCE MATCHING SYSTEM FOR SLAB TYPE LASERS

(71) Applicant: Gerald L Kern, Wadena, MN (US)

(72) Inventor: Gerald L Kern, Wadena, MN (US)

( * ) Notice: Subject to any disclaimer, the term of this patent is extended or adjusted under 35 U.S.C. 154(b) by 0 days.

(21) Appl. No.: 14/566,494

(22) Filed: Dec. 10, 2014

(65) Prior Publication Data

US 2015/0188282 A1    Jul. 2, 2015

Related U.S. Application Data

(60) Provisional application No. 61/921,347, filed on Dec. 27, 2013.

(51) Int. Cl.
| | | |
|---|---|---|
| H01S 3/097 | (2006.01) | |
| H05K 1/16 | (2006.01) | |
| H01R 24/44 | (2011.01) | |
| H01S 3/0971 | (2006.01) | |
| H01S 3/223 | (2006.01) | |
| H01S 3/03 | (2006.01) | |

(52) U.S. Cl.
CPC ............ *H01S 3/09702* (2013.01); *H01R 24/44* (2013.01); *H01S 3/0315* (2013.01); *H01S 3/0971* (2013.01); *H01S 3/2232* (2013.01); *H05K 1/16* (2013.01)

(58) Field of Classification Search
CPC . H01S 3/0315; H01S 3/09702; H01S 3/0971; H01S 3/2232; H01R 24/44; H05K 1/16
See application file for complete search history.

(56) References Cited

U.S. PATENT DOCUMENTS

| | | | |
|---|---|---|---|
| 3,357,690 A | 12/1967 | Firestone | |
| 3,970,497 A | 7/1976 | Glover et al. | |
| 4,177,404 A | 12/1979 | Eguchi | |
| 4,218,628 A | 8/1980 | Harris | |
| 4,260,958 A | 4/1981 | Wayne et al. | |
| 4,469,931 A | 9/1984 | Macken | |
| 4,533,814 A | 8/1985 | Ward | |
| 4,550,273 A | 10/1985 | Boettcher et al. | |
| 4,719,639 A | 1/1988 | Tulip | |

(Continued)

FOREIGN PATENT DOCUMENTS

| | | |
|---|---|---|
| JP | 55067181 | 5/1980 |
| JP | 59148376 | 8/1984 |
| WO | 0017969 | 3/2000 |

OTHER PUBLICATIONS

Avidtek, "What's With the Purple", 2006, http://info.avidtek.com/whypurple.html, AvidTek, Inc.

(Continued)

*Primary Examiner* — Yuanda Zhang
*Assistant Examiner* — Michael Carter
(74) *Attorney, Agent, or Firm* — Merchant & Gould P.C.

(57) ABSTRACT

A system transfers radio frequency energy from a radio frequency power amplifier (RFPA) to a slab laser. The system includes a connector, a printed circuit board, a conductive plate and a first inductor element. The connector is configured to receive a radio frequency power from the RFPA. The printed circuit board has at least one conductive pad etched on the printed circuit board. One of the conductive pads is electrically connected to the connector. The conductive plate is attached beneath the printed circuit board. The first inductor is electrically connected to the connector and electrically connected to a first electrode or top slab of the slab laser.

20 Claims, 7 Drawing Sheets

(56) References Cited

U.S. PATENT DOCUMENTS

| | | |
|---|---|---|
| 4,837,772 A | 6/1989 | Laakmann |
| 4,977,805 A | 12/1990 | Corley, III |
| 5,123,028 A | 6/1992 | Hobart et al. |
| 5,161,697 A | 11/1992 | Quick |
| 5,216,689 A | 6/1993 | Gardner et al. |
| 5,290,383 A | 3/1994 | Koshimizu |
| 5,320,704 A | 6/1994 | Horioka et al. |
| 5,373,528 A | 12/1994 | Kuzumoto et al. |
| 5,426,661 A | 6/1995 | Cohn et al. |
| 5,444,188 A | 8/1995 | Iwayama et al. |
| 5,521,352 A | 5/1996 | Lawson |
| 5,578,229 A | 11/1996 | Barnekov et al. |
| 5,748,663 A | 5/1998 | Chenausky |
| 5,772,817 A | 6/1998 | Yen et al. |
| 5,798,927 A | 8/1998 | Cutler et al. |
| 5,807,761 A | 9/1998 | Coronel et al. |
| 5,904,867 A | 5/1999 | Herke |
| 5,910,894 A | 6/1999 | Pryor |
| 6,104,487 A | 8/2000 | Buck et al. |
| 6,294,124 B1 | 9/2001 | Bauer et al. |
| 6,370,178 B1 | 4/2002 | Papayouanou et al. |
| 6,677,828 B1 | 1/2004 | Harnett et al. |
| 6,788,722 B1 | 9/2004 | Kennedy et al. |
| 7,050,475 B2 | 5/2006 | Monty |
| 7,263,116 B2 | 8/2007 | Shackleton et al. |
| 7,453,918 B2 | 11/2008 | Laughman et al. |
| 7,540,779 B2 | 6/2009 | Papanide et al. |
| 7,558,308 B2 | 7/2009 | Shackleton et al. |
| 7,583,717 B2 | 9/2009 | Monty et al. |
| 7,583,718 B2 | 9/2009 | Monty |
| 7,605,673 B2 | 10/2009 | Robotham |
| 7,729,403 B2 | 6/2010 | Rocca et al. |
| 7,755,452 B2 | 7/2010 | Knickerbocker |
| 7,756,182 B2 | 7/2010 | Newman |
| 7,885,308 B2 | 2/2011 | Robotham et al. |
| 7,988,816 B2 | 8/2011 | Koshiishi et al. |
| 8,116,346 B2 | 2/2012 | Hua et al. |
| 8,199,789 B2 | 6/2012 | Hauer |
| 8,265,116 B2 | 9/2012 | Newman et al. |
| 8,354,893 B2 | 1/2013 | Hauer |
| 8,369,373 B2 | 2/2013 | Allie et al. |
| 8,391,329 B2 | 3/2013 | Fontanella |
| 2002/0107510 A1 | 8/2002 | Andrews |
| 2003/0010420 A1 | 1/2003 | Morrow |
| 2003/0038112 A1 | 2/2003 | Liu et al. |
| 2003/0058913 A1 | 3/2003 | Shackleton et al. |
| 2004/0105478 A1 | 6/2004 | Krasnov |
| 2007/0133643 A1 | 6/2007 | Seguin |
| 2007/0189353 A1 | 8/2007 | Monty |
| 2007/0195839 A1 | 8/2007 | Monty et al. |
| 2009/0004918 A1* | 1/2009 | Papanide ............... H01R 24/44 439/620.03 |
| 2009/0251700 A1 | 10/2009 | Venugopal et al. |
| 2010/0118901 A1 | 5/2010 | Newman et al. |
| 2011/0085580 A1 | 4/2011 | Allie et al. |
| 2012/0219028 A1 | 8/2012 | Morrow et al. |
| 2013/0259074 A1 | 10/2013 | Newman et al. |

OTHER PUBLICATIONS

"CO2 Laser in Operation!", http://physics.mercer.edu/petepag/laserco2-1.html.
Brounley, Richard W., "Mismatched Load Characterization for High-Power RF Amplifiers", 2004, High Frequency Electronics, pp. 30-38.
Villagomez et al., "RF Module in a CO2 hybrid-waveguide laser: Its performance and overall evaluation", Optik 118 (2007) pp. 110-114.
Erik H. Martin, "Compact CO2 Laser Design and Analysis", Thesis, Naval Postgraduate School, Monterey, California, Jun. 1999, 108 pages.
Xin et al, "RF excited diffusively cooled all-metal slab waveguide CO2 laser", Chines Optics Letters, vol. 3, No. 2, Feb. 2005, pp. 83-84.
Bilida et al., "Multi-channel slab CO2 laser excitation with resonant cavities", Optics & Laser Technology, vol. 28, No. 6, 1996, pp. 431-436.

* cited by examiner

IMPEDANCE MATCHING SYSTEM FOR SLAB TYPE LASERS

BACKGROUND OF THE INVENTION

1. Field of the Invention

The present invention is directed to a system and method for transferring radio frequency energy from a radio frequency power supply to a slab type gas laser.

2. Prior Art

Slab type gas lasers, such as carbon dioxide ($CO_2$) lasers, are used for industrial purposes and have developed into lightweight and economical devices for performing various industrial cutting, engraving and similar operations. Metal plates or slabs are utilized as electrodes having a large contact area and forming a chamber between the plates. Typically, cooling is provided within the slabs, such as a water cooling system, to prevent overheating of the laser.

Such a laser typically has a radio frequency power amplifier (RFPA) to provide radio frequency (RF) power to the slabs of the laser. The RF energy creates plasma in the chamber formed between the slabs. Typically, the impedance of the plasma between the slabs and the impedance of the RFPA are not the same. The difference in impedance between the plasma and the RFPA causes a significant loss of power transfer from the RFPA to the laser. This also increases accumulation of heat not only in a laser but in the entire RF circuit system of the laser.

To reduce the problem of energy loss and maximize the power transfer in RF circuits, several systems have been introduced to perform impedance matching between the RFPA and the electrodes of a laser. Combinations of transformers, resistors, inductors, capacitors and transmission lines have been typically used for impedance matching in RF circuits including slab type gas lasers. Although such systems may prevent some of the problems related to power loss and overheating, the systems have not been satisfactory and still have several drawbacks. For example, typical impedance matching systems are placed remotely from laser assemblies and thus require transmission lines or cables to connect the impedance matching systems to the laser assemblies, which cause additional power loss and overheating. Moreover, such systems employ high voltage capacitors, which are expensive and require additional cooling; thereby adding unwanted cost to the manufacturing of lasers.

It can be seen that a new and improved system for matching impedance between a RFPA and a slab type gas laser is required. Such a system should provide a simple and inexpensive adjustable configuration for impedance matching to reduce energy loss and maximize power transfer between a RFPA and electrodes of a slab type gas laser. Moreover, such a system should allow efficient dissipation of heat generated in the system so as to eliminate the necessity of a cooling device in the system. The present invention addresses these as well as other problems associated with impedance matching systems for gas slab lasers.

SUMMARY OF THE INVENTION

The present invention is directed to a system and method for transferring radio frequency energy from a radio frequency power amplifier (RFPA) to a slab laser. The system includes a connector, a printed circuit board, a conductive plate and a first inductor element. The connector is configured to receive a radio frequency power from the RFPA. The printed circuit board has at least one conductive pad etched on the printed circuit board. One of the conductive pads is electrically connected to the connector. The printed circuit board also has an aperture formed therethrough. The conductive plate is attached beneath the printed circuit board and has an opening corresponding to the aperture of the printed circuit board. The first inductor element has a first end and a second end. The first end of the first inductor is electrically connected to the connector, and the second end of the first inductor element is electrically connected to a first electrode or top slab of the slab laser through the aperture of the printed circuit board and the opening of the conductive plate.

In some embodiments, the first inductor element is adjustable in shape or length for setting a predetermined inductance of the system. The first inductor element may be a conductive strap that has a plurality of adjusting holes at the second end thereof. The first inductor element is adjustable in length by, for example, selectively coupling one of the plurality of adjusting holes to a second inductor element. The first inductor element may have a curved portion, the curvature of which is not greater than 180 degree.

In some embodiments, the quantity or dimension of the conductive pads is adjustable by, for example, adding additional pads onto the printed circuit board, or removing them from the printed circuit board, for setting capacitance of the system. The conductive pads may be arranged to be spaced apart around the aperture of the printed circuit board, or to be spaced apart in a row on the printed circuit board.

In other embodiments, the system may further include a second inductor element having a first end and a second end. The first end of the second inductor element is electrically connected to the second end of the first inductor element through the aperture of the printed circuit board and the opening of the conductive plate. The second end of the second inductor element is electrically connected to the first electrode or top slab of the slab laser.

In still other embodiments, the system may further include one or more resistors arranged on the printed circuit board. The resistors may be electrically connected to any of the connectors, the conductive pads, the first inductor element, and the second inductor element, either in parallel or in series, as necessary for adjusting impedance of the system.

These features of novelty and various other advantages that characterize the invention are pointed out with particularity in the claims annexed hereto and forming a part hereof. However, for a better understanding of the invention, its advantages, and the objects obtained by its use, reference should be made to the drawings that form a further part hereof, and to the accompanying descriptive matter, in which there is illustrated and described a preferred embodiment of the invention.

BRIEF DESCRIPTION OF THE DRAWINGS

Referring now to the drawings wherein like reference numerals and letters indicate corresponding structure throughout the several views.

DETAILED DESCRIPTION OF THE PREFERRED EMBODIMENT

Figure 1:
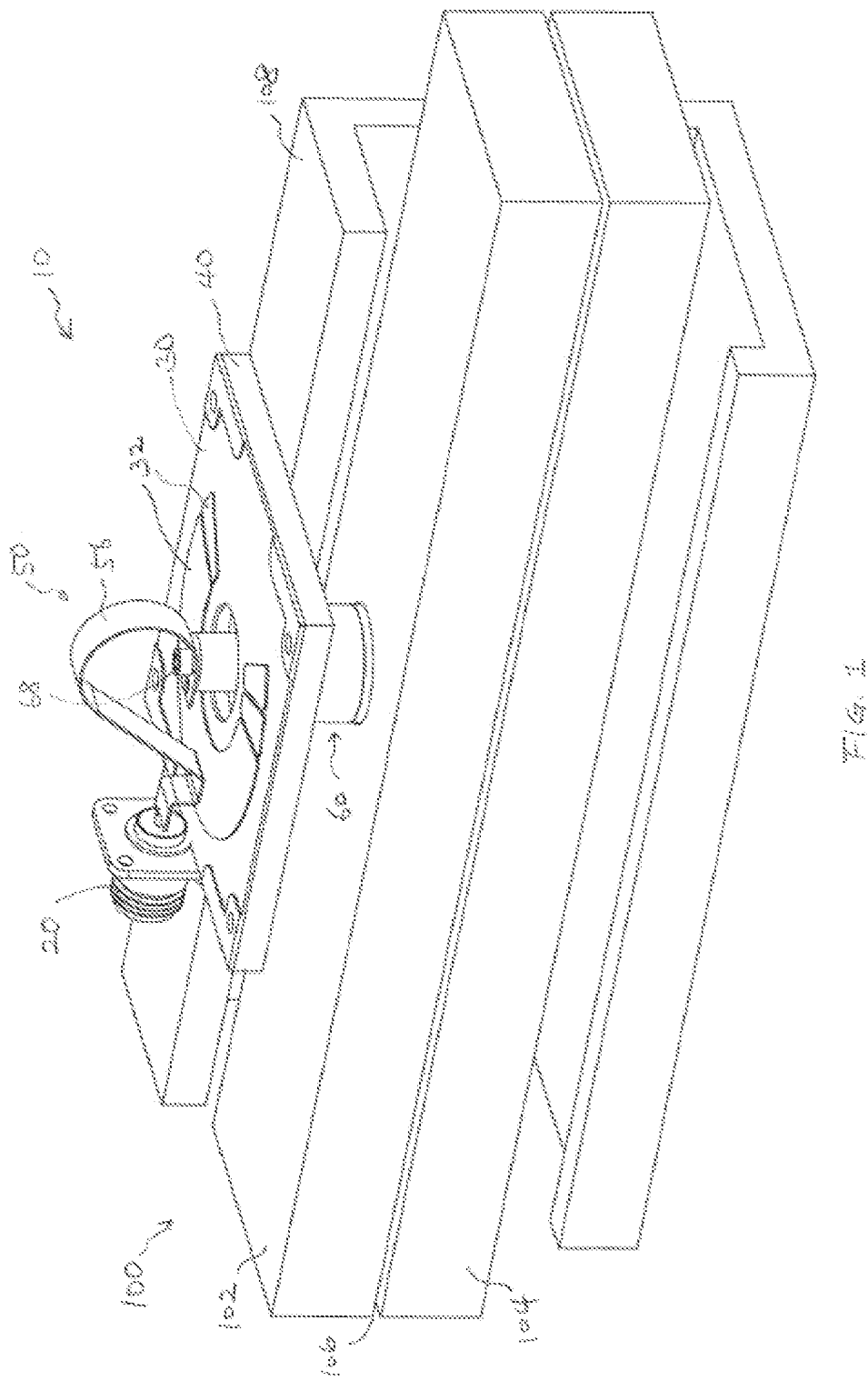
FIG. 1 is a perspective view of a first embodiment of a radio frequency energy transfer system installed on a slab laser according to the principles of the present invention.
Figure 2:
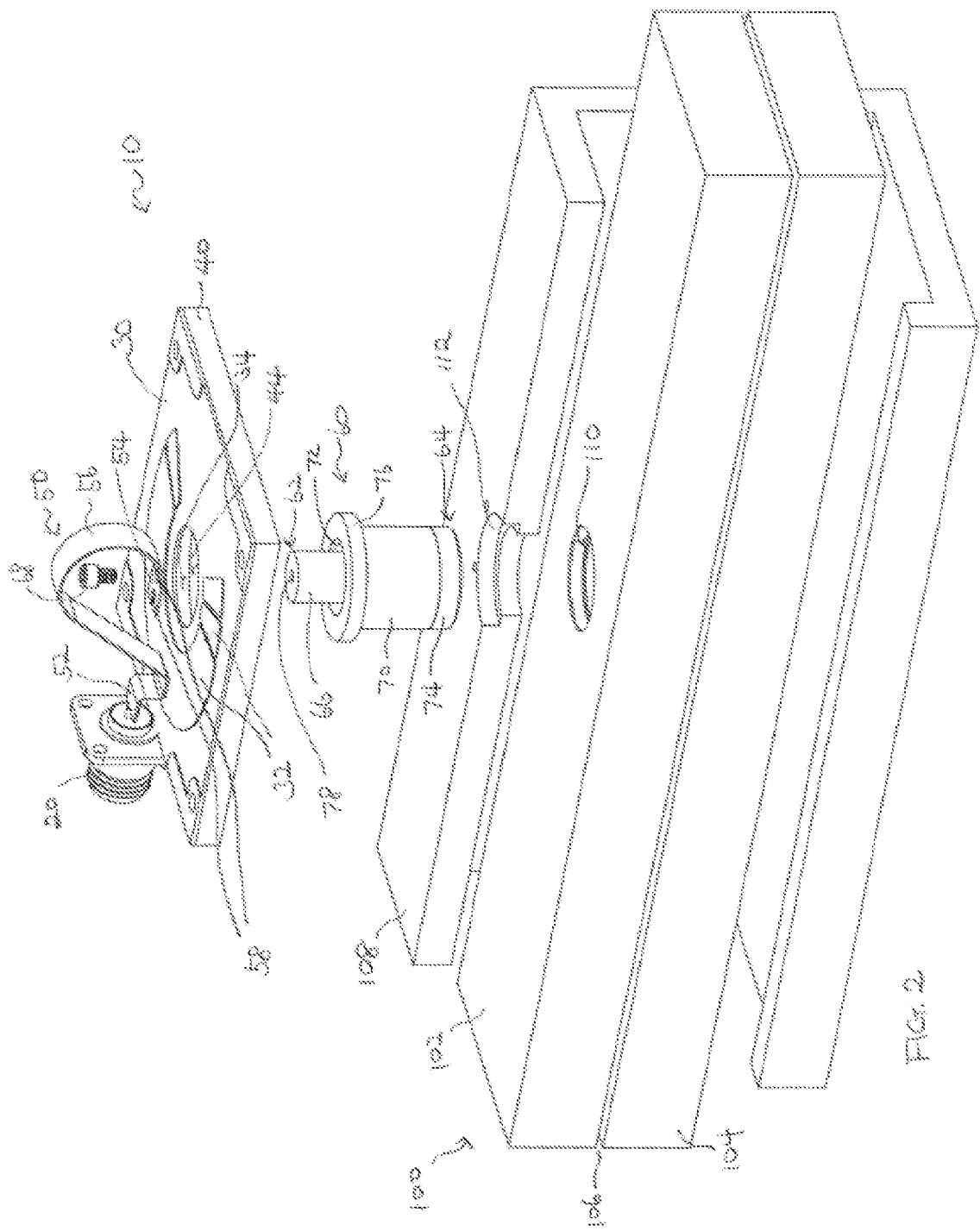
FIG. 2 is an exploded perspective view of the system shown in FIG. 1.
Figure 3:
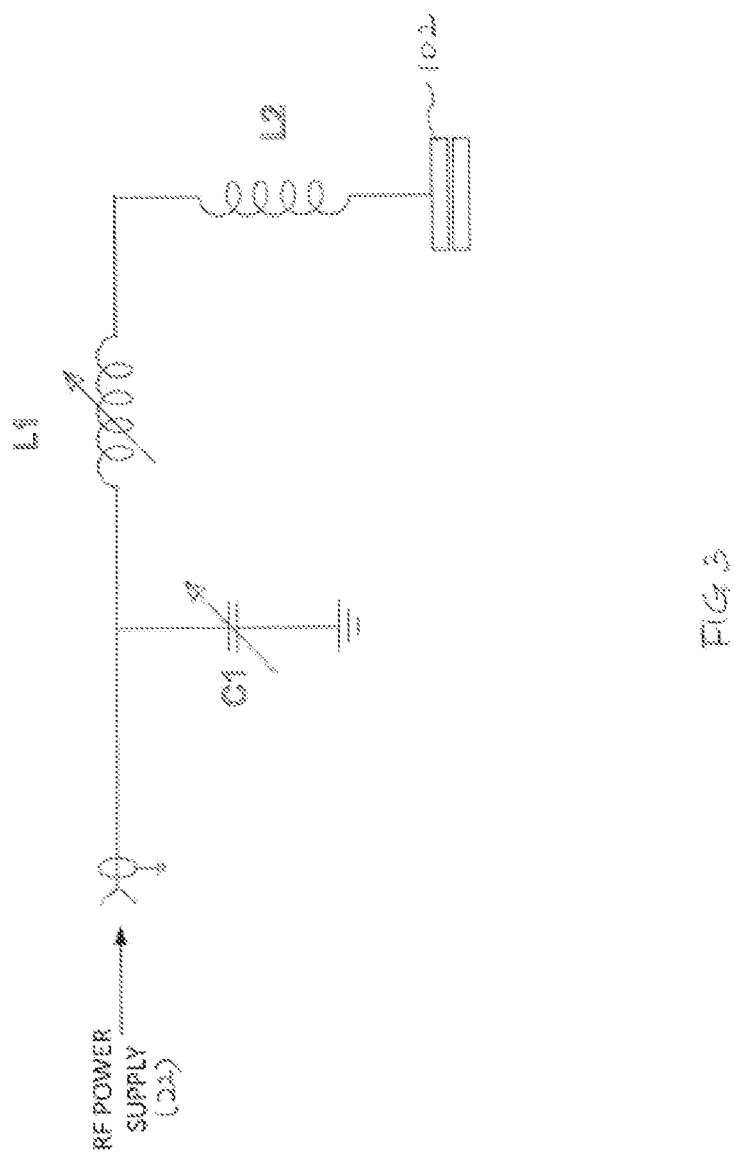
FIG. 3 is a circuit diagram of the system shown in FIG. 1.

Referring now to the drawings and, in particular, to FIGS. 1 and 2, there is shown a slab laser, generally designated (100) including a laser housing (108). The laser (100) includes a top slab (102) and a bottom slab (104), and a laser chamber (106), which is a vacuum gap formed between the top slab (102) and the bottom slab (104). The slabs (102 and 104) act as electrodes for ionizing the laser gases, such as a carbon dioxide ($CO_2$), by radio frequency (RF) power. A radio frequency power amplifier (RFPA) (22) (as shown in FIG. 3), which is also referred to herein as a RF power supply, provides the RF power pulses to the laser chamber (106) through an impedance matching system (10) as described below in more detail. The RFPA (22) is connected to the impedance matching system (10) through a connector (20) arranged in the system (10) to provide the RF power. The top slab (102) includes a socket (110) on its top. The socket (110) is configured to engage a second inductor element (60) so that RF energy from the RFPA (22) is fed through a first inductor element (50) and the second inductor element (60) into the top slab (102). In a preferred embodiment, the socket (110) is placed at the geometric center of the upper surface of the top slab (102). Such centered positioning provides for even dispersion of RF energy.

The impedance matching system (10) includes a printed circuit board (30) to provide one or more capacitors for implementing appropriate capacitance for the impedance matching system. The printed circuit board (30) has an aperture (34) and one or more conductive pads (32). The conductive pads (32) can be created by being etched on the printed circuit board (30). One of the conductive pads (32) is connected to the connector (20) so that the conductive pad is connected to the RFPA (22). In this embodiment, the conductive pads (32) are arranged around the aperture (34) and are equally spaced apart. However, the arrangement of the conductive pads (32) can be modified to meet particular design changes, provided that they operate as capacitors in the system (10).

The conductive pads (32) can be added on, or removed from, the printed circuit board (30) to set a predetermined capacitance of the impedance matching system (10). For example, a new conductive pad (32) can be attached on the printed circuit board (30) adjacent to the existing conductive pads (32) by soldering. Any soldered pad (32) can be removed from the printed circuit board (30) by desoldering. The dimension of each conductive pad (32) may also vary as necessary for setting a predetermined capacitance. The capacitance provided by one or more conductive pads arranged on the printed circuit board (30) replaces separate capacitor elements that are required by conventional impedance matching networks.

The impedance matching system (10) includes a conductive plate (40) that is attached to the bottom of the printed circuit board (30). The conductive plate (40) has an opening (44) that corresponds to the aperture (34) of the printed circuit board (30). The opening (44) is aligned with the aperture (34) of the printed circuit board (30) when the conductive plate (40) is attached underneath the printed circuit board (30). The conductive plate (40) is configured to be one plate of a capacitor while the conductive pads (32) work as the other plate of the capacitor. With this configuration, the printed circuit board (30) that has been etched functions as a dielectric between the conductive pads (32) and the conductive plate (40). Furthermore, the conductive plate (40) also functions as a heat sink of the impedance matching system (10) by dissipating heat generated in the capacitors formed by the printed circuit board (30) into the atmosphere.

The impedance matching system (10) further includes a first inductor element (50). The first inductor element (50) is configured to be adjustable in shape and/or length for setting inductance of the system (10). The first inductor element (50) is made with a conductive strap or ribbon having a first end (52) and a second end (54). The first end (52) is electrically connected to the connector (20), and the second end (54) is configured to be electrically connected to the top slab (102) of the slab laser (100). As discussed below, the second end (54) of the first inductor element (50) may be electrically connected to the top slab (102) through a second inductor element (60) interposed therebetween. The first inductor element (50) is configured and arranged to have the second end (54) located above or adjacent the aperture (34) of the printed circuit board (30) and the opening (44) of the conductive plate (40) so that the second end (54) is electrically connected to the second inductor element (60).

The first inductor element (50) includes a plurality of adjusting holes (58) at the second end (54) thereof. The adjusting holes (58) are selectively coupled to the second inductor element (60), as explained below in further detail, so that the length of the first inductor element (50) is adjusted for setting an inductance as necessary. In this embodiment, there are two adjusting holes (58) are arranged at the second end (54) of the first inductor element (50). In other embodiments, there may be more than two adjusting holes (58) for more flexible adjustment of inductance. In other embodiments, the first inductor element (50) is also adjustable in length by adding another conductive strap for setting a predetermined inductance. One or more additional conductive straps may be electrically connected in series to the second end (54) of the first inductor element (50) by fastening, for example.

Furthermore, the first inductor element (50) can have a curved portion (56) between the first end (52) and the second end (54). The curved portion (56) is configured to provide different lengths of the first inductor element (50) and thus to set different inductances as necessary. The curved portion (56) may have a variable shape and/or diameter while the first end (52) and the second end (54) of the first inductor element (50) remain fixed as described above. For example, the curved portion (50) forms substantially a loop or ring of the first inductor element (50), as shown in FIGS. 1 and 2. In other embodiments, the curved portion (50) can form various spirals or twisted shapes. Furthermore, the curved portion (56) is configured to increase inductance of the first inductor element (50) within a limited space. However, the first inductor element (50) may be configured as a flat conductive strap without the curved portion (56) if such a flat shape of the first inductor element (50) has a sufficient dimension for setting a predetermined inductance. As such, the curvature of the first inductor element (50) is not more than 180 degrees. In other embodiments, the first inductor element (50) may have a different shape and/or length as necessary to implement a certain inductance and meet a particular space constraint.

The impedance matching system (10) may include the second inductor element (60). The second inductor element (60) is a cylindrical member with a conductive shaft (66) and an insulating housing (70) at least partially surrounding the conductive shaft (66). An annular air gap (72) is formed between the insulating housing (70) and the conductive shaft (66). The second inductor element (60) has a first end (62) and a second end (64) opposite to the first end (62) along a longitudinal axis of the second inductor element (60). The conductive shaft (66) is configured to be electrically connected to the second end (54) of the first inductor element (50) at the first end (62) of the second inductor element (60). A bolt (68) may be used to fasten the connection between the conductive shaft (66) and the second end (54) of the first inductor element (50). In particular, one of the adjusting holes (58) is aligned with a threaded hole (78) on the first end (62) of the second inductor element (60), and the bolt (68) fastens into the adjusting hole (58) of the first inductor element (50) and the threaded hole (78) of the second inductor element (60). By selecting a different hole (58) of the first inductor element (50), the length of the first inductor element (50), and thus the inductance thereof, may be adjusted. The conductive shaft (66) is arranged to pass through the aperture (34) of the printed circuit board (30) and the opening (44) of the conductive plate (40) when the conductive shaft (66) is electrically connected to the second end (54) of the first inductor element (50).

The second inductor element (60) includes a conductive coupling portion (74) at the second end (64) of the second inductor element (60). The conductive coupling portion (74) is electrically connected to the socket (110) of the top slab (102). The conductive coupling portion (74) is also electrically connected to the conductive shaft (66) within the insulating housing (70). The second inductor element (60) also includes a lip (76) formed on the insulating housing (70). The lip (76) is configured to be placed in a nest portion (112) of the laser housing (108) and provide a vacuum seal for the laser housing (108). An example of the second inductor element (60) and the connection between the second inductor element (60) and the top slab (102) is disclosed in a U.S. provisional patent application No. 61/790,736 ("LASER WITH IMPROVED RADIO FREQUENCY ENERGY DISTRIBUTION" filed by Gerald L. Kern on Mar. 15, 2013), the entirety of which is herein incorporated by reference.

In alternate embodiments, the impedance matching system (10) may be configured without the second inductor element (60). In such a structure, the second end (54) of the first inductor element (50) may directly be electrically connected to the top slab (102) of the slab laser (100).

FIG. 3 shows a circuit diagram of the impedance matching system (10) of FIGS. 1 and 2. A capacitor, designated as C1, refers to the capacitor implemented by the conductive pads (32) and the conductive plate (40) with the printed circuit board (30) therebetween. A first inductor, designated as L1, represents the first inductor element (50), the inductance of which is adjustable as necessary. A second inductor, designated as L2, indicates the second inductor element (60) which has a set inductance. The capacitor (C1) is electrically connected to the RFPA (22), in parallel, and the first and second inductors (L1 and L2) are electrically connected to the RFPA (22) in series.

In some embodiments, the impedance matching system (10) may include one or more resistors arranged on the printed circuit board (30). The resistor(s) may be electrically connected to any of the connector (20), the capacitance implemented by the conductive pads (32), the first inductor element (50) and the second inductor element (60), either in parallel or in series, as necessary for achieving desired impedance matching circuitry between the RFPA (22) and the top slab (102) of the laser (100).

Figure 4:
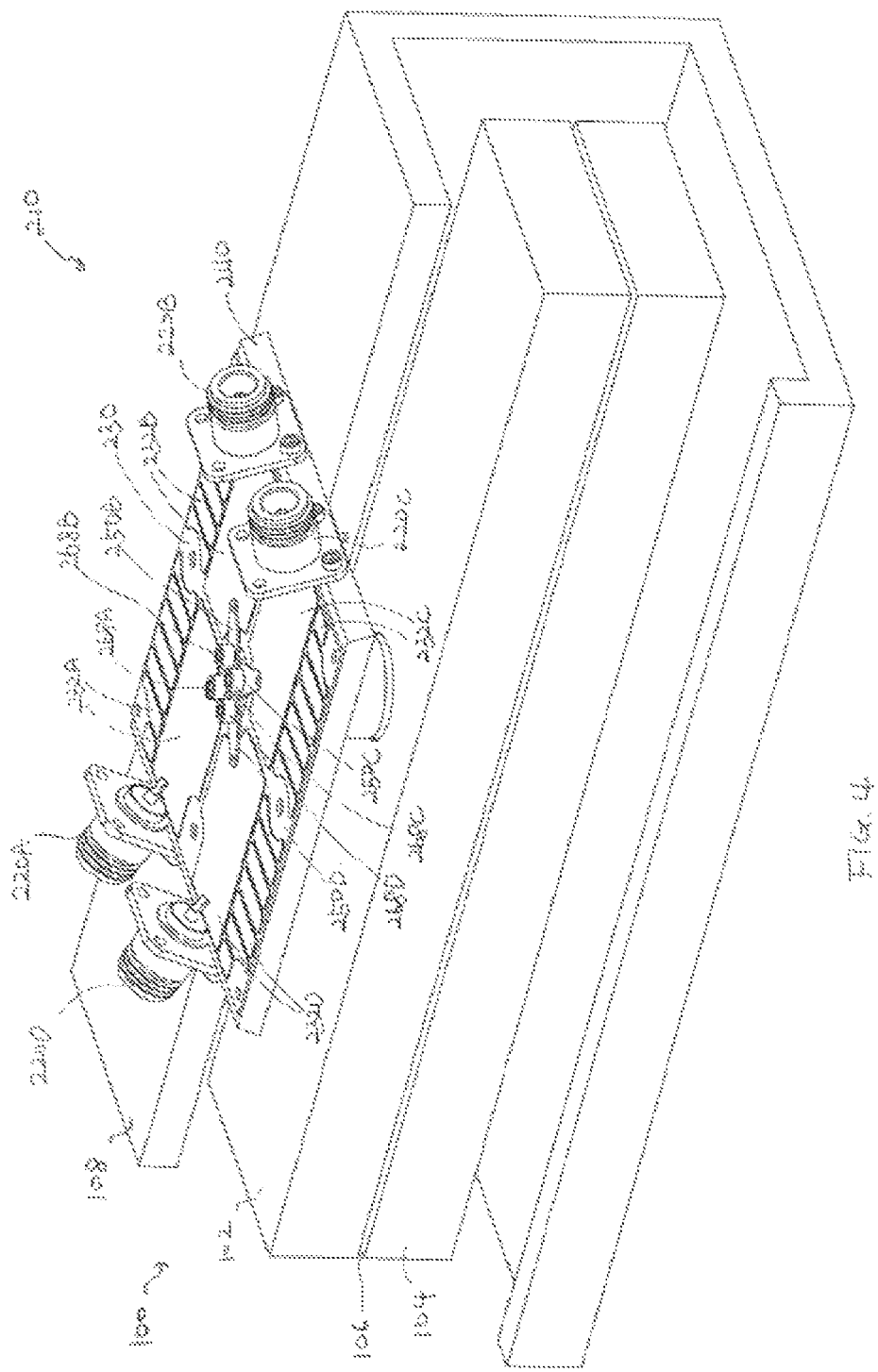
FIG. 4 is a perspective view of a second embodiment of a radio frequency energy transfer system installed on a slab laser according to the principles of the present invention.
Figure 5:
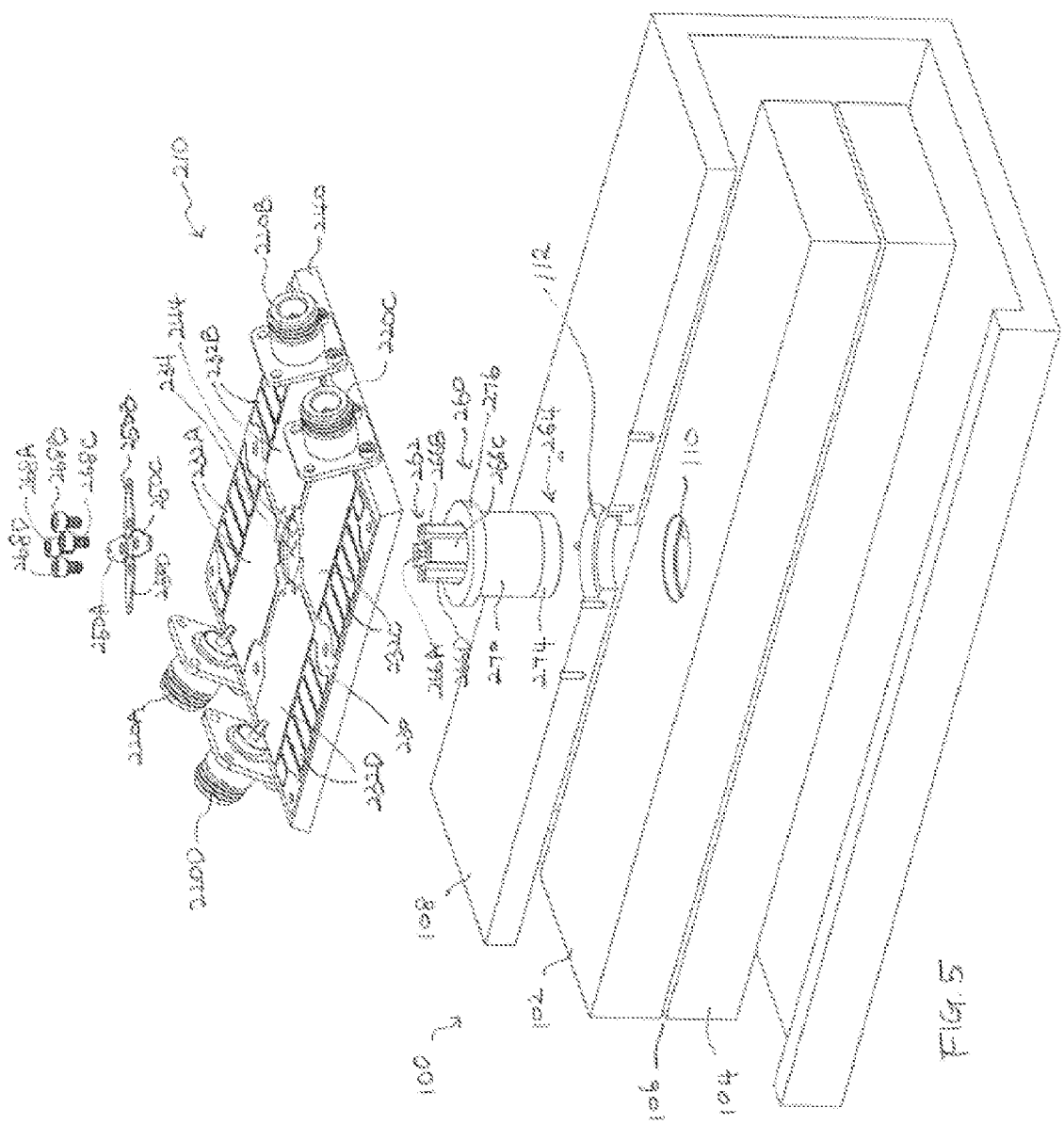
FIG. 5 is an exploded perspective view of the system shown in FIG. 4.
Figure 6:
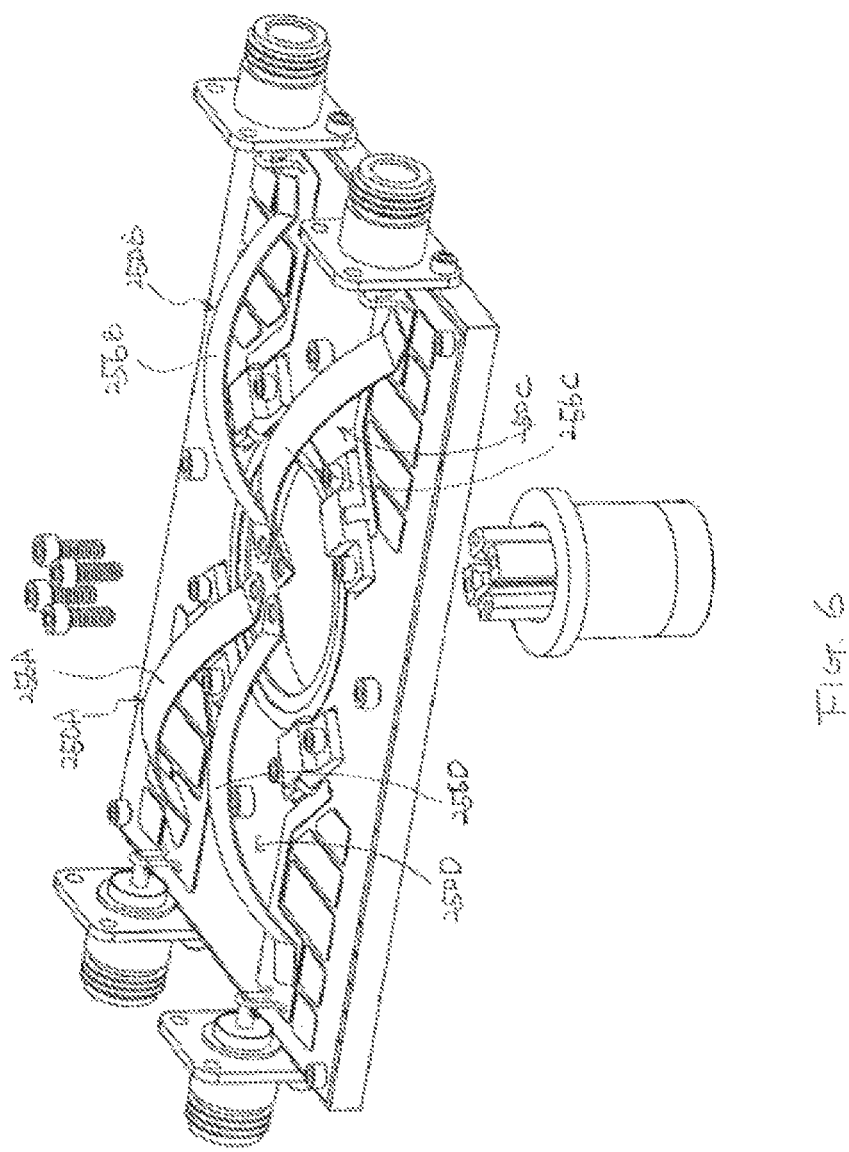
FIG. 6 is an exploded perspective view of a third embodiment of a radio frequency energy transfer system installed on a slab laser according to the principles of the present invention.

FIGS. 4-6 illustrate another embodiment of an impedance matching system (210) for the slab laser (100). This system (210) is configured for a higher power transfer than the impedance matching system (10). The impedance matching system (210) has the same structures as the impedance matching system (10), except that the system (210) is configured for multiple RFPA or RF power supplies (including four RF power supplies in the embodiment shown in FIGS. 4-6). The impedance matching system (210) shown in FIGS. 4-6 includes four connectors (220A, 220B, 220C and 220D), four sets of conductive pads (232A, 232B, 232C and 232D), four first inductor elements (250A, 250B, 250C and 250D), and four conductive shafts (266A, 266B, 266C and 266D) of a second inductor element (260).

Figure 7:
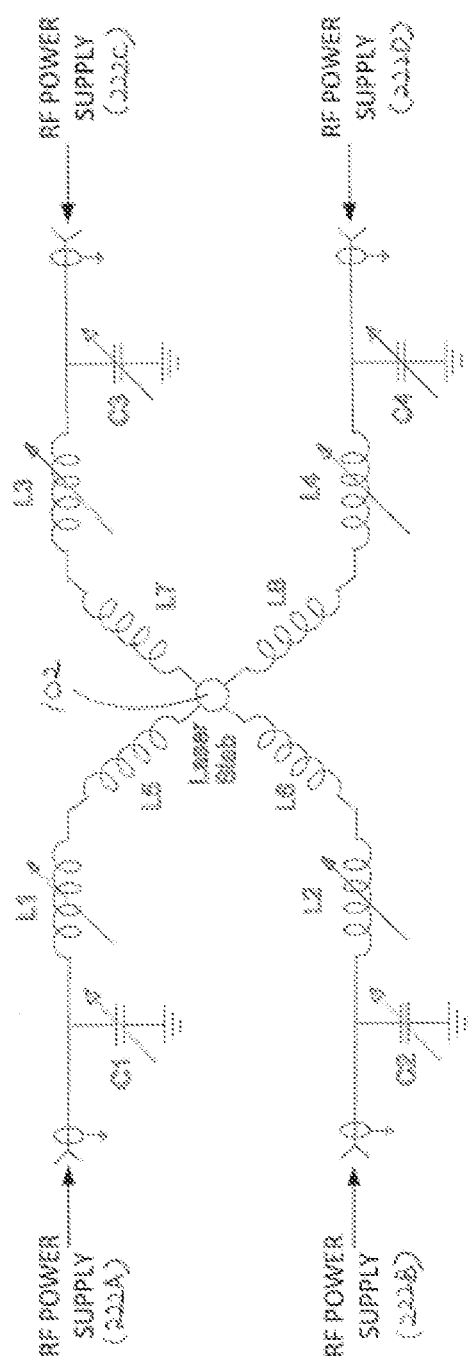
FIG. 7 is a circuit diagram of the system shown in FIG. 4.

Each of the four connectors, the four sets of conductive pads, the four first inductor elements, and the four conductive shafts are arranged and electrically connected in a manner similar to that for the impedance matching system (10). For example, the connector (220A) is provided for receiving RF power from a RFPA or RF power supply (222A) (as shown in FIG. 7) and is electrically connected to one of the conductive pads (232A) created by etching on a printed circuit board (230). Other conductive pads (232A) are arranged in a row on the printed circuit board (230) adjacent to the one of the conductive pads (232A). One of the first inductor elements (250A) is electrically connected to the connector (220A) through the one of the conductive pads (232A) and is also electrically connected to the conductive shaft (266A) of the second inductor element (260). The first inductor elements (250A-D) may have different lengths for setting an inductance as necessary. The conductive shaft (266A) is electrically connected to a conductive coupling portion (274) within the insulating housing (270), and the conductive coupling portion (274) is electrically connected to the top slab (102) through the socket (110) formed on the top slab (102). Similarly, the remaining first inductor elements (250B, 250C and 250C) are electrically connected to the connectors (220B, 220C and 220D) through the conductive pads (232B, 232C and 232D), respectively. The first inductor elements (250B, 250C and 250D) are also electrically connected to the conductive shafts (266B, 266C and 266D) of the second inductor element (260), respectively. All of the conductive shafts (266A, 266B, 266C and 266D) are electrically connected to the conductive coupling portion (274), which is electrically connected to the top slab (102) through the socket (110) formed on the top slab (102). This configuration of the conductive coupling portion (274) for electrically connecting all of the conductive shafts (266A-D) to the top slab (102) at the surface of the top slab (102) combines RF power from the four RF supplies (222A-D) at the actual location in which the top slab (102) needs the RF power. This significantly reduces RF power loss that typically occurs in other laser systems in which a plurality of RFPAs is combined at a certain location external to such other laser systems and, then, the combination of the RF power from the plurality of RFPAs is delivered to the top slab through an impedance matching circuit. Therefore, such other laser systems dissipate a significant amount of heat from their impedance matching circuits and thus require a cooling system, such as a water cooling system, for the circuits. As the amount of heat released or heat loss is proportional to the square of the current, combining multiple RFPAs after each RFPA passes through an impedance matching circuit is preferable for reducing the power loss at the impedance matching system to combining them before the impedance matching circuit.

Similarly to the conductive pads (32), the conductive pads (232A, 232B, 232C and 232D) may also be added on, or removed from, the printed circuit board (230) to set a predetermined capacitance of the impedance matching system (210). Furthermore, similarly to the first inductor element (50), the first inductor element (250A, 250B, 250C or 250D) is adjustable in length for setting a predetermined inductance. As with the first inductor element (50) in the first embodiment, the length of the first inductor elements (250A, 250B, 250C and 250D) are adjusted by selecting one of the different adjusting holes of each first inductor element (250A, 250B, 250C or 250D) and coupling it to the second inductor element (60). In other embodiments, the length of the first inductor element (250A, 250B, 250C or 250D) is changeable by adding or removing another conductive strap. As shown in FIGS. 4 and 5, the first inductor elements (250A, 250B, 250C and 250D) are configured as flat conductive straps without curved portions. However, the first inductor elements (250A, 250B, 250C and 250D) may have different shapes including conductive straps with curved portions (256A, 256B, 256C and 256D) as shown in FIG. 6. In some embodiments, however, the first inductor elements, as well as the second inductor element, may be configured not to be adjustable and to have a set inductance based on the length or dimension of the first inductor element.

FIG. 7 shows a circuit diagram of the impedance matching system (210) of FIGS. 4-6. Capacitors, designated as C1, C2, C3 and C4, refer to the capacitors implemented by the conductive pads (232A, 232B, 232C and 232D) and a conductive plate (240) with the printed circuit board (230) therebetween, respectively. First inductors, designated as L1, L2, L3 and L4, represent the first inductor elements (250A, 250B, 250C and 250D), respectively, the inductance of which are adjustable as necessary. Second inductors, designated as L5, L6, L7 and L8, indicate the conductive shafts (266A, 266B, 266C and 266D) of the second inductor element (260), respectively. The capacitors (C1, C2, C3 and C4) are electrically connected to four RF power supplies (222A, 222B, 222C and 222D) in parallel, respectively, and the first inductors (L1, L2, L3 and L4) and the second inductors (L5, L6, L7 and L8) are electrically connected to the four RF power supplies (222A, 222B, 222C and 222D) in series, respectively.

The impedance matching system according to the present invention is located close to the electrodes of a laser, and thus can minimize the power loss that typically occurs in other laser systems having an impedance matching system remote from a laser body. The impedance matching system of the present disclosure also eliminates use of separate capacitors that are expensive in an impedance matching network for slab lasers. Furthermore, the impedance matching system of the present invention has a configuration of the conductive plate that achieves efficient dissipation of heat generated in the system. These distinctive structures of the impedance matching system increase overall efficiency of the slab laser system.

It is to be understood, however, that even though numerous characteristics and advantages of the present invention have been set forth in the foregoing description, together with details of the structure and function of the invention, the disclosure is illustrative only, and changes may be made in detail, especially in matters of shape, size and arrangement of parts within the principles of the invention to the full extent indicated by the broad general meaning of the terms in which the appended claims are expressed.

What is claimed is:

1. A system for transferring radio frequency energy from a radio frequency power amplifier to a slab laser, the slab laser having a first electrode and a second electrode, the system comprising:
a connector for receiving a radio frequency power input;
a printed circuit board having at least one conductive pad and an aperture, the at least one conductive pad being etched on the printed circuit board, wherein one of the at least one conductive pad is electrically connected to the connector;
a conductive plate attached on a bottom of the printed circuit board and having an opening corresponding to the aperture of the printed circuit board; and
a first inductor element having a first end and a second end, wherein the first end of the first inductor element is electrically connected to the connector, and wherein the second end of the first inductor element is electrically connected to the first electrode of the slab laser through the aperture of the printed circuit board and the opening of the conductive plate.

2. The system of claim 1, wherein the first inductor element is configured to be adjustable in shape or length to set inductance of the system.

3. The system of claim 1, wherein the at least one conductive pad is adjustable in quantity or dimension to set capacitance of the system.

4. The system of claim 1, further comprising a second inductor element having a first end and a second end, wherein the first end of the second inductor element is electrically connected to the second end of the first inductor element through the aperture of the printed circuit board and the opening of the conductive plate, and wherein the second end of the second inductor element is electrically connected to the first electrode of the slab laser.

5. The system of claim 4, wherein the second inductor element includes a conductive shaft, an insulating housing and a conductive coupling portion, the insulating housing at least partially surrounding the conductive shaft with an air gap therebetween, wherein the conductive shaft is electrically connected to the second end of the first inductor element at the first end of the second inductor element and electrically connected to the conductive coupling portion at the second end of the second inductor element, and wherein the conductive coupling portion is mounted to the first electrode of the slab laser and electrically connected to the first electrode of the slab laser.

6. The system for claim 5, further comprising:
a second connector for receiving a second radio frequency power input; and
a second first inductor element having a first end and a second end, wherein the first end of the second first inductor element is electrically connected to the second connector;
wherein the second inductor element includes a second conductive shaft, the second conductive shaft electrically connected to the second end of the second first inductor element at the first end of the second inductor element and electrically connected to the conductive coupling portion at the second end of the second inductor element.

7. The system of claim 1, wherein the first inductor element is a conductive strap, the conductive strap being adjustable in length and being configured to have a curved portion.

8. The system of claim 7, wherein a curvature of the first inductor element is not greater than 180 degrees.

9. The system of claim 1, comprising a plurality of the conductive pads, wherein the conductive pads are spaced apart around the aperture of the printed circuit board.

10. The system of claim 1, comprising a plurality of the conductive pads, wherein the conductive pads are spaced apart in a row.

11. The system of claim 1, further comprising a resistor, the resistor being arranged on the printed circuit board, wherein the resistor is electrically connected to the connector and electrically connected to the first inductor element.

12. A laser system comprising:
a first electrode;
a second electrode;
a laser chamber defined by the first electrode and the second electrode; and
an impedance matching system including:
   a connector configured for connecting to a radio frequency power input;
   a printed circuit board having at least one conductive pad and an aperture, the at least one conductive pad being etched on the printed circuit board, wherein one of the at least one conductive pad is connected to the connector;
   a conductive plate having an opening corresponding to the aperture of the printed circuit board and attached on the bottom of the printed circuit; and
   a first inductor element having a first end and a second end, wherein the first end of the first inductor element is electrically connected to the connector, and wherein the second end of the first inductor element is electrically connected to the first electrode of the slab laser through the aperture of the printed circuit board and the opening of the conductive plate.

13. The laser system of claim 12, wherein the first inductor element is configured to be adjustable in shape or length to set inductance of the system.

14. The laser system of claim 12, wherein the at least one conductive pad is adjustable in quantity or dimension to set capacitance of the system.

15. The laser system of claim 12, further comprising a second inductor element having a first end and a second end, wherein the first end of the second inductor element is electrically connected to the second end of the first inductor element through the aperture of the printed circuit board and the opening of the conductive plate, and wherein the second end of the second inductor element is electrically connected to the first electrode of the slab laser.

16. The laser system of claim 15, wherein the second inductor element includes a conductive shaft, an insulating housing and a conductive coupling portion, the insulating housing at least partially surrounding the conductive shaft with an air gap therebetween, wherein the conductive shaft is electrically connected to the second end of the first inductor element at the first end of the second inductor element and electrically connected to the conductive coupling portion at the second end of the second inductor element, and wherein the conductive coupling portion is mounted to the first electrode of the slab laser and electrically connected to the first electrode of the slab laser.

17. A method for transferring radio frequency energy from a radio frequency power amplifier to a slab laser, the slab laser having a first electrode and a second electrode, the method comprising:
   creating an aperture in a printed circuit board;
   etching at least one conductive pad on the printed circuit board;
   attaching a conductive plate under the printed circuit board, wherein the conductive plate has an opening which corresponds to the aperture of the printed circuit board and is aligned with the aperture of the printed circuit board when the conductive plate is attached under the printed circuit board;
   connecting a radio frequency power input to one of the at least one conductive pads;
   connecting a first end of a conductive strap to the radio frequency power input; and
   connecting a second end of the conductive strap to the first electrode of the slab laser.

18. The method of claim 17, further comprising:
determining a capacitance to match impedances between the radio frequency power amplifier and the slab laser; and
setting the determined capacitance by adjusting a quantity or a dimension of the at least one conductive pads on the printed circuit board.

19. The method of claim 17, further comprising:
determining an inductance to match impedance between the radio frequency power amplifier and the slab laser; and
setting the determined inductance by adjusting a length or shape of the conductive strap.

20. The method of claim 17, further comprising:
connecting a first end of an inductor rod to the second end of the conductive strap through the aperture of the printed circuit board and the opening of the conductive plate; and
connecting a second end of the inductor rod to the first electrode of the slab laser.

* * * * *